(12) United States Patent
Taub et al.

(10) Patent No.: US 9,685,204 B2
(45) Date of Patent: *Jun. 20, 2017

(54) CROSS-POINT MEMORY SINGLE-SELECTION WRITE TECHNIQUE

(71) Applicant: Intel Corporation, Santa Clara, CA (US)

(72) Inventors: Mase J Taub, Folsom, CA (US); Sandeep K. Guliani, Folsom, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/189,314

(22) Filed: Jun. 22, 2016

(65) Prior Publication Data

US 2016/0336048 A1 Nov. 17, 2016

Related U.S. Application Data

(63) Continuation of application No. 14/289,858, filed on May 29, 2014, now Pat. No. 9,384,831.

(51) Int. Cl.
*G11C 7/00* (2006.01)
*G11C 13/00* (2006.01)
*G11C 5/02* (2006.01)

(52) U.S. Cl.
CPC ............. *G11C 7/00* (2013.01); *G11C 5/02* (2013.01); *G11C 13/0004* (2013.01); *G11C 13/004* (2013.01); *G11C 13/0069* (2013.01); *G11C 2013/0076* (2013.01); *G11C 2013/0078* (2013.01); *G11C 2013/0092* (2013.01); *G11C 2213/77* (2013.01)

(58) Field of Classification Search
CPC .................................................. G11C 13/0004
USPC ........................................................ 365/148
See application file for complete search history.

(56) References Cited

U.S. PATENT DOCUMENTS 9,384,831 B2 * 7/2016 Taub ................... G11C 13/0004
2008/0101131 A1 5/2008 Lee et al.

FOREIGN PATENT DOCUMENTS

KR 100809333 B1 3/2008

OTHER PUBLICATIONS

Office Action received for Korean Patent Application No. 10-2015-0058016, mailed on Jul. 14, 2016, 4 pages including 1 pages of English translation.
English Translation of the Notice of Preliminary Rejection, Application No. 10-2015-0058016, Mailed Feb. 24, 2017, pages.

* cited by examiner

*Primary Examiner* — Hoai V Ho
(74) *Attorney, Agent, or Firm* — Compass IP Law PC

(57) ABSTRACT

A system and technique is disclosed for writing data in a cross-point memory. The state of one or more memory cells of the cross-point memory are sensed and then are continued to be selected and left on. It is then determined which of the one or more memory cells are to change state based on incoming user data that is to be written into the one or more memory cells. The one or more memory cells determined to change state and are still selected to be on are then written by applying a write-current pulse to the memory cells. In one exemplary embodiment, the one or more memory cells comprise one or more phase-change-type memory cell devices.

26 Claims, 9 Drawing Sheets

CROSS-POINT MEMORY SINGLE-SELECTION WRITE TECHNIQUE

CROSS-REFERENCE TO RELATED APPLICATIONS

The present application is a continuation of U.S. application Ser. No. 14/289,858 filed on May 29, 2014. Said application Ser. No. 14/289,858 is hereby incorporated herein by reference in its entirety

TECHNICAL FIELD

Embodiments of systems and techniques described herein relate to memory systems. More particularly, embodiments of systems and techniques described herein relate to a write technique for a cross-point memory that combines a memory cell selection process for a pre-read operation and for a write (SET/RESET) operation into a single-selection write operation.

BACKGROUND

A cross-point memory comprises one or more memory cells arranged in an array. Each memory cell is coupled to a bit line (BL) and a word line (WL). Typically, the bit lines comprise a set of substantially parallel electrically conductive traces that are formed in a first horizontal plane, and the word lines are another set of substantially parallel electrically conductive traces that are formed in a second horizontal plane. The bit lines extend in a first direction and the word lines extend in a second direction so that the bit lines and the word lines appear to intersect when viewed from above the first and second horizontal planes. A memory cell is located at each crossing point of the bit lines and the word lines in an intersection region that is vertically spaced between the bit lines and the word lines. Typically, a particular memory cell is selected by applying a voltage to the bit line and a voltage to the word line that are coupled to the memory cell.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
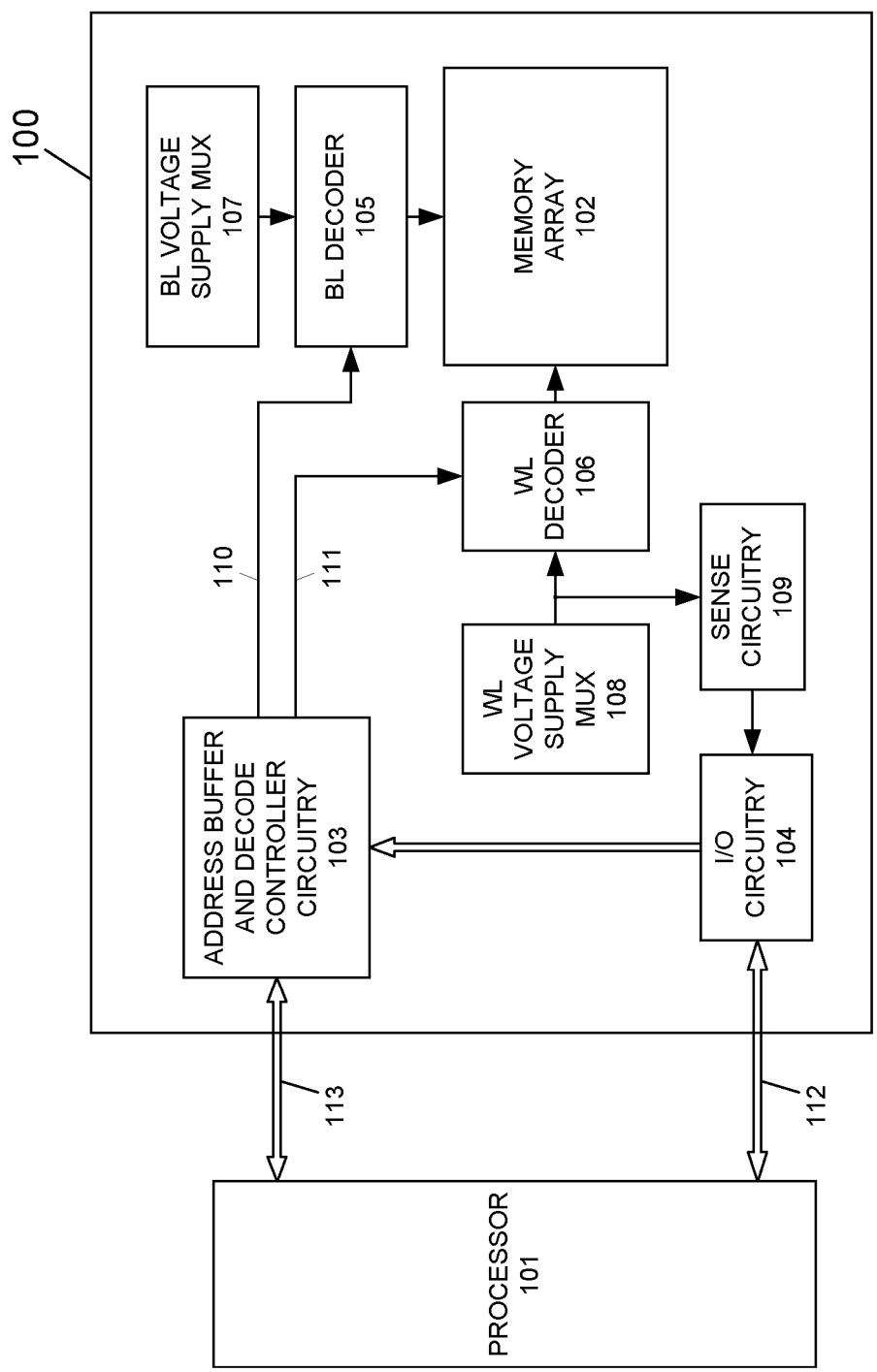
FIG. 1 depicts a functional block diagram of an exemplary embodiment of a memory device that utilizes a write technique for a cross-point memory that combines a memory cell selection process for a pre-read operation and for a write operation into a single-selection write operation according to the subject matter disclosed herein.

It will be appreciated that for simplicity and/or clarity of illustration, elements depicted in the figures have not necessarily been drawn to scale. For example, the dimensions of some of the elements may be exaggerated relative to other elements for clarity. The scaling of the figures does not represent precise dimensions and/or dimensional ratios of the various elements depicted herein. Further, if considered appropriate, reference numerals have been repeated among the figures to indicate corresponding and/or analogous elements.

DESCRIPTION OF THE EMBODIMENTS

Embodiments described herein relate to systems and techniques that provide a write technique for a cross-point memory that combines a memory cell selection process for a pre-read operation and for a write (SET/RESET) operation into a single-selection write operation. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. Additionally, the word "exemplary" is used herein to mean "serving as an example, instance, or illustration." Any embodiment described herein as "exemplary" is not to be construed as necessarily preferred or advantageous over other embodiments.

Various operations may be described as multiple discrete operations in turn and in a manner that is most helpful in understanding the claimed subject matter. The order of description, however, should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Embodiments of the subject matter disclosed herein provide a write technique for a cross-point memory that combines a memory cell selection process for a pre-read operation and for a write operation into a single-selection write operation, thereby providing a reduced write-completion time and a reduced overall energy consumption (E/bit). In one exemplary embodiment, the single-selection write technique disclosed herein provides a write-completion time that is about 30 ns less than the write-completion time associated with a write technique that utilizes separate pre-read selection and write selection operations. Additionally, the single-selection write technique disclosed herein consumes about 10 pJ/bit less write energy than a write technique that comprises separate pre-read selection and write selection operations, thereby resulting in an improved write bandwidth capability of about 6.5% for the same power envelope.

FIG. 1 depicts a functional block diagram of an exemplary embodiment of a memory device 100 that utilizes a write technique for a cross-point memory that combines a memory cell selection process for a pre-read operation and for a write operation into a single-selection write operation according to the subject matter disclosed herein. In the exemplary embodiment of memory device 100 depicted in FIG. 1, memory device 100 is depicted as being coupled to an external processor 101. Processor 101 may be a microprocessor or some other type of controller. In another exemplary embodiment, memory device 100 and processor 101 could be integrated to form a single device or component. In another exemplary embodiment, memory device 100 could be, but is not limited to, part of a solid-state memory array or a solid-state drive. It should be understood that memory device 100 is depicted in a simplified manner to focus on features of memory device 100 that are helpful for understanding the subject matter disclosed herein.

Memory device 100 comprises a memory array 102, an address buffer and decoder controller circuitry 103, I/O circuitry 104, a bit line (BL) decoder 105, a word line (WL) decoder 106, an BL power supply multiplexer (MUX) 107, a WL power supply multiplexer (MUX) 108, and sense circuitry 109. In one exemplary embodiment, memory array 102 comprises one or more memory cells arranged as a cross-point memory.

I/O circuitry 104 provides bi-directional communication of data through signal path 112 between memory device 100 and processor 101. I/O circuitry 104 also receives address signals from processor 101 through signal path 112 that are used to access memory array 102. Address buffer and decoder controller circuitry 103 latches the address signals that are provided through I/O circuitry 104 from processor 101. Address buffer and decoder controller circuitry 103 outputs a BL decode control signal 110 to BL decoder 105 and a WL decode control signal 111 to WL decoder 106. BL decoder 105 and WL decoder 106 respectively output bit line and word line selection signals to access a selected memory cell in memory array 102. It should be understood that the number of address input connections depends on the density and architecture of the memory array 102. That is, the number of addresses increases as both the memory cell count increases and as the tile, partition, bank and/or block count increases.

Memory device 100 reads (senses) data in memory array 102 by sense circuitry 109 sensing voltage and/or current changes in a signal output from WL voltage supply multiplexer 108. In one exemplary embodiment, sense circuitry 109 couples sensed data to I/O circuitry 104, which provides one or more buffered data connections 112 to provide bi-directional data communication with processor 101. Additionally, I/O circuitry 104 includes buffer circuitry for buffering address communications.

Address buffer and decode controller circuitry 103 also receives control signals 113 from processor 101. Control signals 113 are used to control the operations of memory device 100 including, but not limited to, data read and bit alterable data write (program/erase) operations. Address buffer and decode controller circuitry 103 may be a state machine, a sequencer, or some other type of controller to generate control signals that control the operations of memory device 100. In one exemplary embodiment, address buffer and decode controller circuitry 103 is configured to control the timing and generation of voltages to write data to and read data from memory array 102. It should be understood that all of the control signals generated by address buffer and decode controller circuitry 103 are depicted in FIG. 1.

Figure 2:
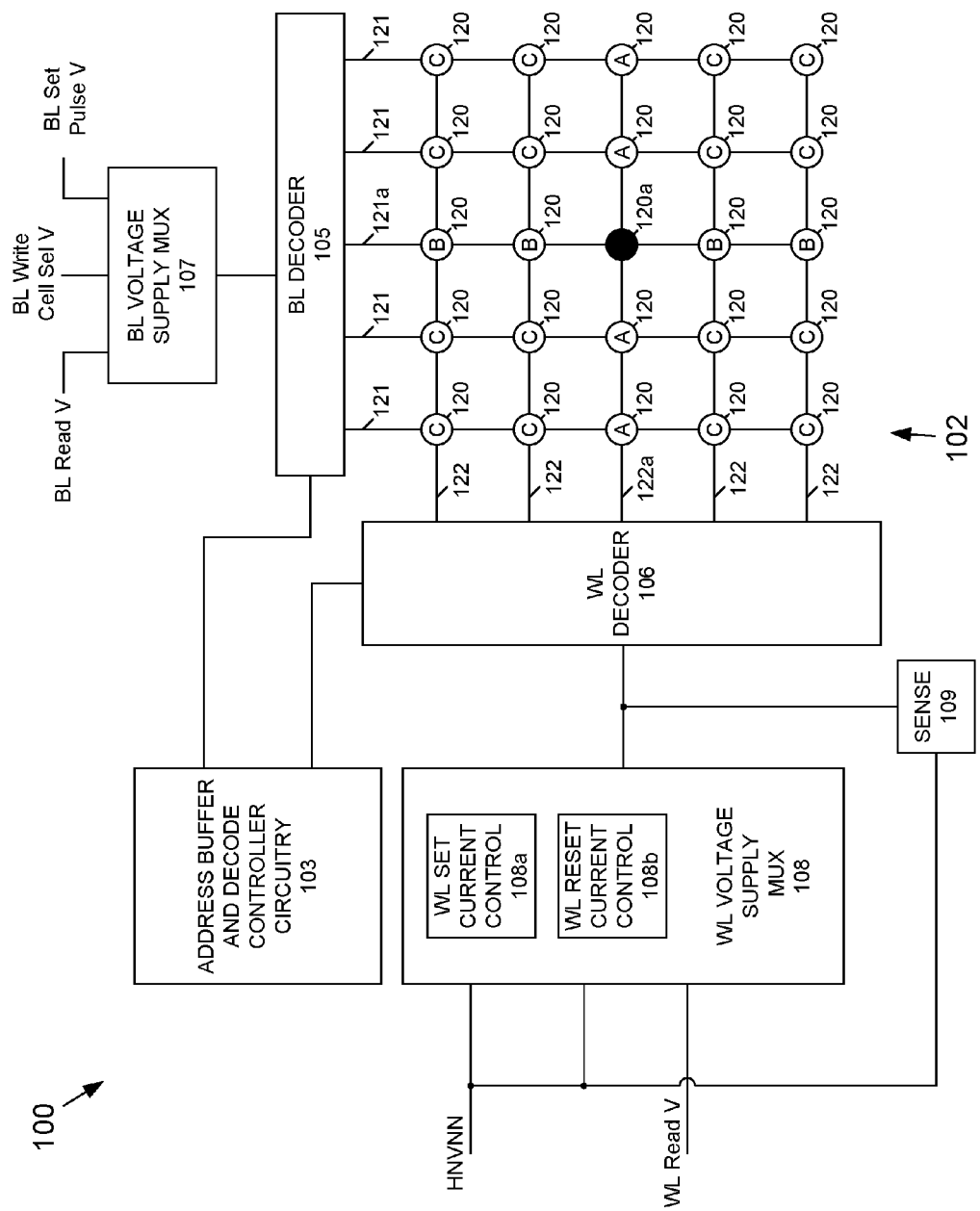
FIG. 2 depicts another functional block diagram of an exemplary embodiment of memory device that utilizes a write technique for a cross-point memory that combines a memory cell selection process for a pre-read operation and for a write (SET/RESET) operation into a single-selection write operation according to the subject matter disclosed herein.

FIG. 2 depicts another functional block diagram of an exemplary embodiment of memory device 100 that utilizes a write technique for a cross-point memory that combines a memory cell selection process for a pre-read operation and for a write (SET/RESET) operation into a single-selection write operation according to the subject matter disclosed herein. Memory array 102 comprises one or more memory cells 120 arranged to form a cross-point memory. In one exemplary embodiment, memory array 102 comprises, but is not limited to, part of a solid-state memory array or a solid-state drive.

Each memory cell 120 is respectively coupled in a well-known manner to a bit line (BL) 121 and a word line (WL) 122. In one exemplary embodiment, bit lines 121 comprise a set of substantially parallel electrically conductive traces that are formed in a first horizontal plane, and word lines 122 are another set of substantially parallel electrically conductive traces that are formed in a second horizontal plane. Bit lines 121 extend in a first direction and word lines 122 extend in a second direction so that the bit lines and the word lines appear to intersect when viewed from above the first and second horizontal planes. A memory cell 120 is located at each crossing point of the bit lines 121 and the word lines 122 in an intersection region that is vertically spaced between the bit lines 121 and the word lines 122. Although FIG. 2 depicts five bit lines 121 and five word lines 122, it should be understood that the number of bit lines and word lines could be much greater than or less than five. Additionally, it should be understood that in some exemplary embodiments the number of bit lines and the number of word lines are not necessarily equal. Moreover, the cross-point memory arrangement of memory array 102 provides is configured to be fully bit addressable.

In one exemplary embodiment, memory cells 120 comprise phase-change memory cells, such as, but not limited to, a chalcogenide-material memory cell, such as, but not limited to $Ge_2Sb_2Te_5$, in which phase changes are manifested by whether the chalcogenide material is in a crystalline state (high conductivity) or an amorphous state (low conductivity). In operation, when a memory cell is selected to change state (i.e., from a high conductivity state (SET) to a low conductivity state (RESET), or from a low conductivity state (RESET) to a high conductivity state (SET)), current is passed (or written) through the memory cell to transition the phase-change material. Depending on the amount of current that is written through the memory cell, the memory cell either changes state into either the high conductivity state or the low conductivity state. For example, if a first level of current is written to the memory cell for a first selected period of time, the material of the memory cell crystallizes, whereas if a second, larger level of current is written to the memory cell to a second selected period of time, the material of the memory cell become amorphous.

In operation, a particular memory cell 120 is selected by applying a voltage to the bit line 121 and a voltage to the word line 122 that are coupled to the memory cell. For example, suppose the memory cell 120a depicted in FIG. 2 by a solid black circle is to be selected to be, for example, read or written (change state). Suppose also for this example that the memory cells 120 of memory array 102 are selected when 4 V is applied across the memory cell. To select memory cell 120a, a voltage of, for example, +2 V is applied to the line 121a, which is coupled to memory cell 120a, and a voltage of, for example, −2 V is applied to word line 122a, which is coupled to memory cell 120a, while all other bit lines and word lines remain at ground. Because the voltage across memory cell 120a is 4 V, memory cell 120a is selected. All memory cells indicated as "A" cells would only have 2 V across the memory cell (i.e., only −2 V from the charged word line) and are, therefore, not selected. All memory cells indicated as "B" cells would also only have 2 V across the memory cell (i.e., only +2 V from the charged bit line), and are, therefore, not selected. All memory cells indicated a "C" would have no volts across the memory cells and would not be selected.

Voltages BL Read V, BL Write Cell Sel V and BL Set Pulse V are coupled to inputs of BL voltage supply MUX 107. The output of BL voltage supply MUX 107 is coupled to an input to BL decoder 105. A regulated voltage HNVNN and a WL Read V voltage are coupled to inputs of WL voltage supply MUX 108. The output of WL voltage supply MUX 108 is coupled to an input of WL decoder 106.

For a cross-point memory array, such as memory array 102, the Write Bandwidth is approximately 256 B/t_write-completion, in which B represents a byte, and t_write-completion is the time to complete a simultaneous 16-partition write operation. In one exemplary embodiment, memory array 102 is configured as 16 partitions in which each partition comprises 128 bits and is organized as 16 eight-bit bytes. Additionally, the overall power consumption for a write operation for a cross-point memory is E/bit*Bandwidth*8, in which E is the energy consumed per bit per write operation, and the multiplicative factor of 8 accounts for converting from bytes to bits. Accordingly, the Write Bandwidth of a cross-point memory array, such as memory array 102, can be limited by the write-completion time and/or by the overall power consumption (which is proportional to E/bit) caused by system power delivery and/or thermal constraints.

Figure 3:
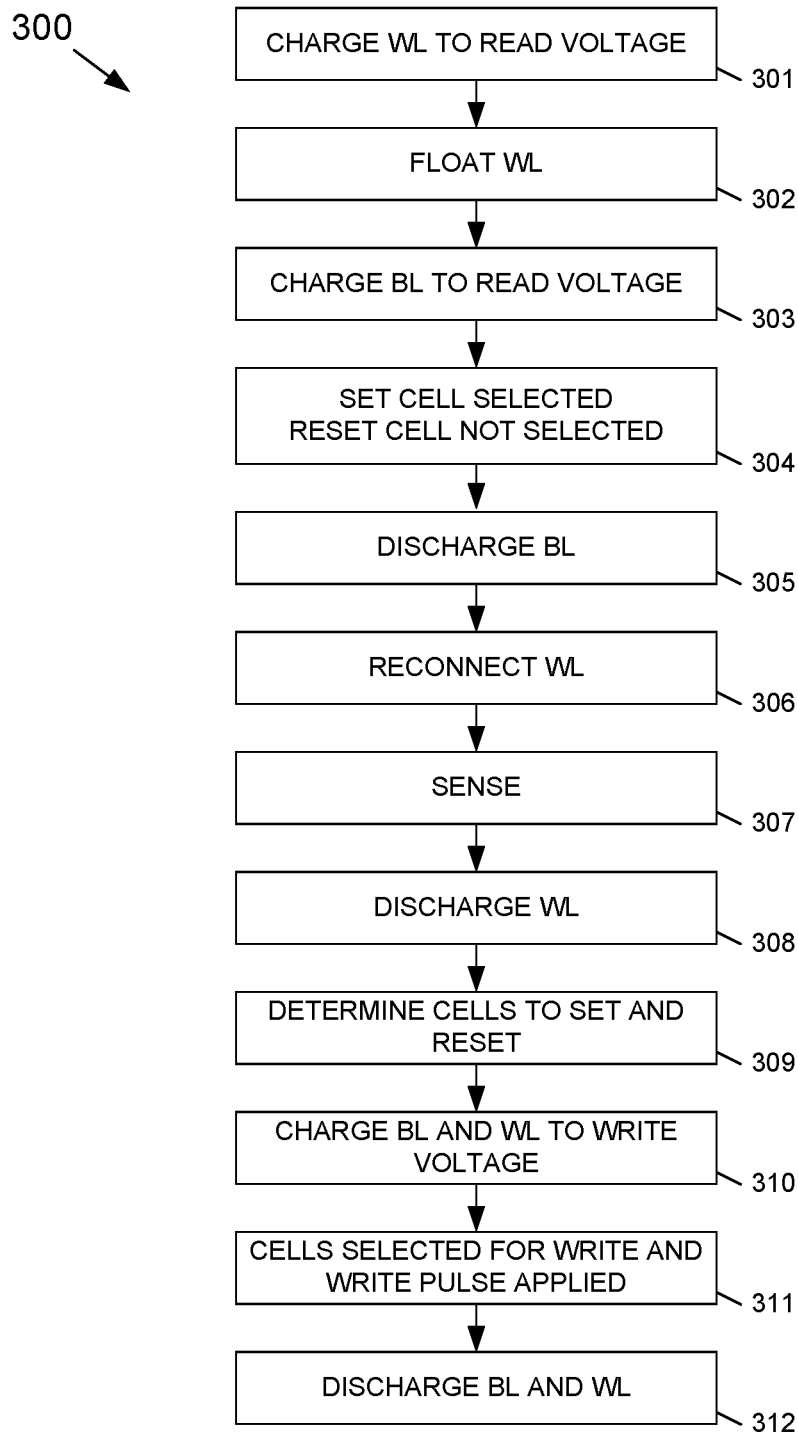
FIG. 3 depicts a flow diagram for an exemplary embodiment of a write technique for a partition of memory cells of a cross-point memory that uses a separate pre-read selection and a separate write selection operations.

FIG. 3 depicts a flow diagram for an exemplary embodiment of a write technique 300 for a partition of memory cells of a cross-point memory that uses a separate pre-read selection and a separate write selection operations. The exemplary embodiment of a write technique depicted in FIG. 3 comprises three phases: a pre-read phase, a mask phase and a write phase. Additionally, the exemplary embodiment of FIG. 3 utilizes a float-read (pre-read) operation prior to the write operation. It should be understood that although the exemplary embodiment of write technique 300 is described for a partition of memory cells, it should be understood that the operations of write technique 300 are applicable for any number of memory cells.

Figure 4A:
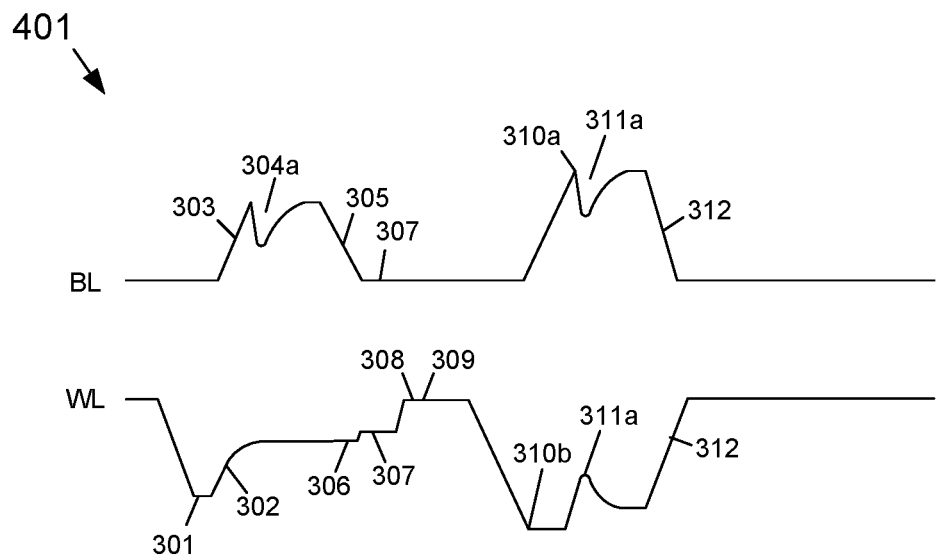
FIG. 4A depicts a waveform diagram corresponding to the operations of write technique depicted in FIG. 3 for memory cells being written from the SET to the RESET state.
Figure 4B:
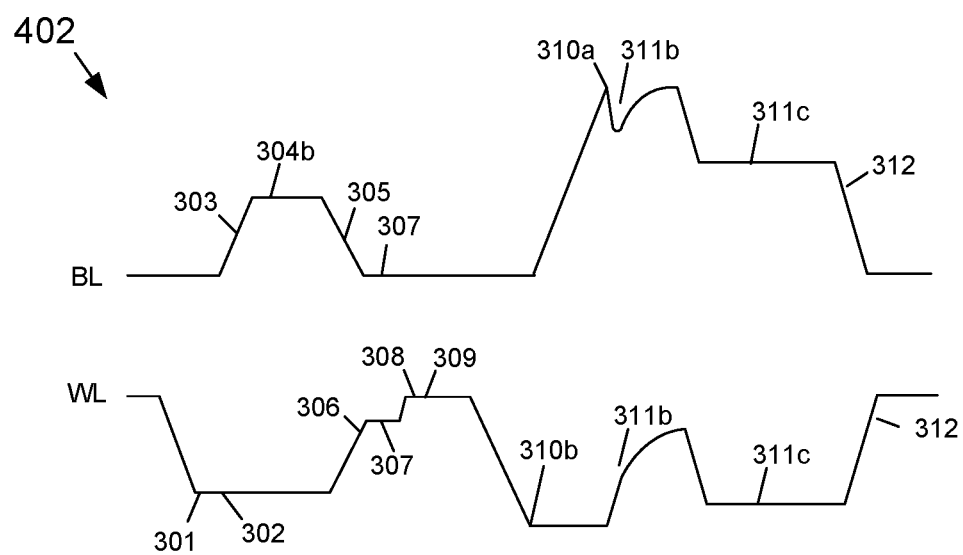
FIG. 4B depicts a waveform diagram corresponding to the operations of write technique depicted in FIG. 3 for memory cells being written from the RESET to the SET state.

FIG. 4A depicts a waveform diagram 401 corresponding to the operations of write technique 300 for memory cells being written from the SET to the RESET state. FIG. 4B depicts a waveform diagram 402 corresponding to the operations of write technique 300 for memory cells being written from the RESET to the SET state. The reference numerals in FIGS. 4A and 4B indicate portions of the respective waveforms corresponding to the particular operations of write technique 300. Additionally, for the following example based on FIGS. 3, 4A and 4B, memory cells in the SET state are selected (i.e., turned on) if a voltage greater than the threshold voltage ($VT_S$) is applied across the memory cell, which for this example is about 5.5 V. Memory cell in the RESET state are selected (i.e., turned on) if a voltage greater than the threshold voltage ($VT_R$) is applied across the memory cell, which for this example is about 8 V. It should be noted that the different voltage levels of the waveforms in FIGS. 4A and 4B are not specifically indicated and it is intended that the different parts of the waveforms are shown in a relative relationship with respect to other parts of the waveforms.

The pre-read phase of write technique 300 begins at block 301 where the operations of address buffer and decode controller circuitry 103 and WL decoder 106 have occurred so that word lines that are part of write technique 300 are selected. Additionally, at block 301, the selected word lines are charged to a read voltage (WL Read V in FIG. 2). That is, WL voltage supply MUX 108 couples WL Read V to WL Decoder 106 and the selected word lines charge to WL Read V. In one exemplary embodiment, WL Read V is about −2 V. At block 302, the charged word lines are floated, i.e., WL voltage supply MUX 108 disconnects WL Read V from the charged word lines.

At block 303, the operations of address buffer and decode controller circuitry 103 and BL decoder 105 have occurred so that bit lines that are part of the write technique 300 are selected. Also at block 303, the selected bit lines are charged to a read voltage (BL Read V in FIG. 2). That is, BL voltage supply MUX 107 couples BL Read V to BL Decoder 105 and the selected bit lines are charged to BL Read V. In one exemplary embodiment, BL Read V is about +3 V.

At block 304, if a memory cell is in the SET state (i.e., logic 1), the memory cell is selected (304a in FIG. 4A) while if a memory cell is in the RESET state (i.e., logic 0); the memory cell is not selected (304b in FIG. 4B). If a memory cell is selected (i.e., in the SET state), the memory cell begins to conduct (also referred to herein as the cell has "snapped") (304a in FIG. 4A) and there is charge sharing between the capacitance of the bit line connected to the memory cell and the capacitance of the floating word line connected to the memory cell. The memory cell will continue to conduct until the hold voltage across the cell is no longer maintained. When the voltage across the cell is less than the hold voltage, then the cell will turn-off and charge sharing will stop. The charge sharing is depicted in FIGS. 4A and 4B as waveforms having a transient-type or a decaying-type of appearance. If a memory cell is not selected (i.e., is in the RESET state), the memory cell does not conduct and there is no charge sharing between the bit line connected to the memory cell and the floating word line connected to the memory cell.

At block 305, the bit lines are discharged. At block 306, the word lines are reconnected so that sense 109 can read the memory cells. At block 307, the memory cells are sensed (i.e., read) by sense 109 (FIG. 2). At block 308, the word lines are discharged, thereby completing the first selection operation of write technique 300.

After the float read operation of blocks 301-308, the state of the memory cells are known. That is, if a memory cell was selected (i.e., snapped), the memory cell is sensed by sense 109 and determined to be in the SET state. If a memory cell was not selected (i.e., did not snap), the memory cell is sensed by sense 109 and determined to be in the RESET state.

Flow continues to the mask phase at block 309 where it is determined whether a memory cell is to change state or remain in its current state. In one exemplary embodiment, the current states of the memory cells are compared to the incoming user data to determine whether the state of a particular memory cell is to be changed (or written) during the write operation. Cells that do not need to be changed are masked off and will not receive a write pulse during the write phase.

The write phase begins at block 310. To write a memory cell in a cross-point memory, such as memory 102, two events occur. First, a memory cell must be selected, i.e., turned on. To select a memory cell, a voltage that is greater than the threshold voltage $VT_{SET}$ or $VT_{RESET}$ of the cell, that is, about 5.5 V should be applied across a SET memory cell and about 8 V should be applied across a RESET memory cell. After a memory cell has been selected, the state of the memory cell is changed based on a current profile of the current that is enabled to flow through the memory cell. In one exemplary embodiment, the current profile used is a square current pulse in which if the memory cell is to be changed from RESET to SET, a relatively low current of, for example, about 50 μA is passed through the cell for about 200 ns. If the memory cell is to be changed from SET to RESET, the current profile used is a square current pulse in which, for example, about 100 μA is passed through the cell for about 10 ns. In another exemplary embodiment, a SET and RESET current profile that is used is different from the SET and RESET square current pulse just described. The specific current profile is controlled by WL SET CURRENT CONTROL 108a and by WL RESET CURRENT CONTROL 108b in FIG. 2. It should be noted that after a memory cell has been selected for a write operation, the voltage required to keep the memory cell selected is a function of the current and resistance in the path through the memory cell. Because the current is controlled in accordance with the particular current profile that is used and because there is a variable amount of resistance in the path to the cell, the voltage on the word line coupled to a selected memory cell varies widely. Accordingly, the description herein of the exemplary operations of FIG. 3 will focus on the voltage applied to the memory array in the word line path of the selected cell, i.e., about −4 V.

Returning to block 310 in FIG. 3, the bit lines of the memory cells that are to be written (i.e., not masked) are charged toward a write cell selection voltage (BL Write Sel V) of, for example, about 4 V (310a in FIGS. 4A and 4B), and the word lines are charged to the write voltage of, for example, about −4 V (310b in FIGS. 4A and 4B). In one exemplary embodiment, the write voltage connected to the word lines is HNVNN. While FIGS. 4A and 4B depict the word lines being charged to the write voltage before the bit lines are charged to the write voltage, it should be understood that the bit lines could be charged to the write voltage before the word lines are charged to the write voltage.

At block 311, if a memory cell is in the SET state and is to be changed to the RESET state, the memory cell is selected (i.e., turns on) and begins to conduct, and a RESET write-current pulse is applied as depicted by the transient-type waveform indicated at 311a in FIG. 4A. The state of the memory cell is changed from SET to RESET. If a memory cell is in the RESET state and is to be changed to the SET state, the memory cell is selected (i.e. turns on) and begins to conduct as depicted by the transient-type waveform indicated at 311b in FIG. 4B. Next, the bit line is connected to a SET pulse voltage (BL Set Pulse V in FIG. 2), for example, about 3 V in FIG. 4B and a SET write-current pulse is applied as depicted at 311c. The state of the memory cell is changed from RESET to SET. In one exemplary embodiment, the sequence of SET-to-RESET and RESET-to-SET write-current pulses are as shown in FIGS. 4A and 4B. That is, a SET-to-RESET write-current pulse occurs at a different time from a RESET-to-SET write-current pulse. In another exemplary embodiment, the SET-to-RESET and RESET-to-SET write-current pulses occur substantially simultaneously. At block 312, the bit lines and word lines are discharged, thereby completing write technique 300.

Figure 5:
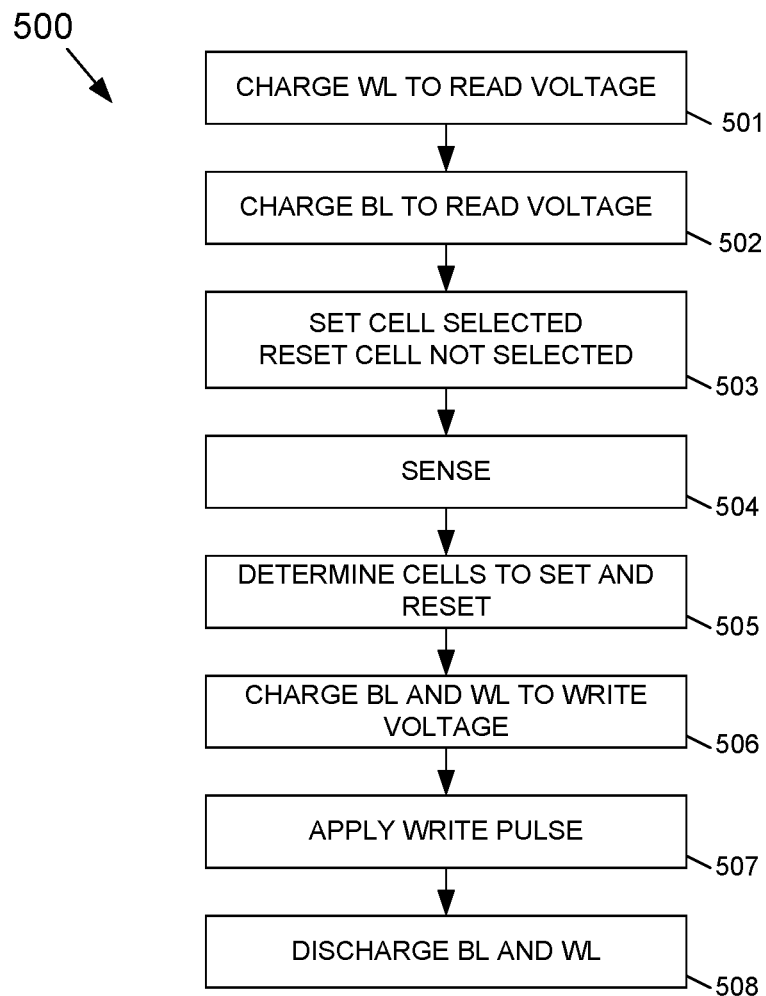
FIG. 5 depicts a flow diagram of another exemplary embodiment of a write technique for a partition of memory cells of a cross-point memory that uses a single-selection operation according to the subject matter disclosed herein.

FIG. 5 depicts a flow diagram of another exemplary embodiment of a write technique 500 for a partition of memory cells of a cross-point memory that uses a single-selection operation according to the subject matter disclosed herein. Write technique 500 provides an advantage over write technique 300 by providing a reduced write-completion time and a reduced overall power consumption (E/bit). In one exemplary embodiment, write technique 500 provides a write-completion time that is about 30 ns less than the write-completion time associated with a write technique 300. Additionally, write technique 500 reduce write energy consumption by about 10 pJ/b in comparison to write technique 300, thereby resulting in an improved write bandwidth capability of about 6.5% over write technique 300 for the same power envelope. It should be understood that although the exemplary embodiment of write technique 500 is described for a partition of memory cells, it should be understood that the operations of write technique 500 are applicable for any number of memory cells.

Figure 6A:
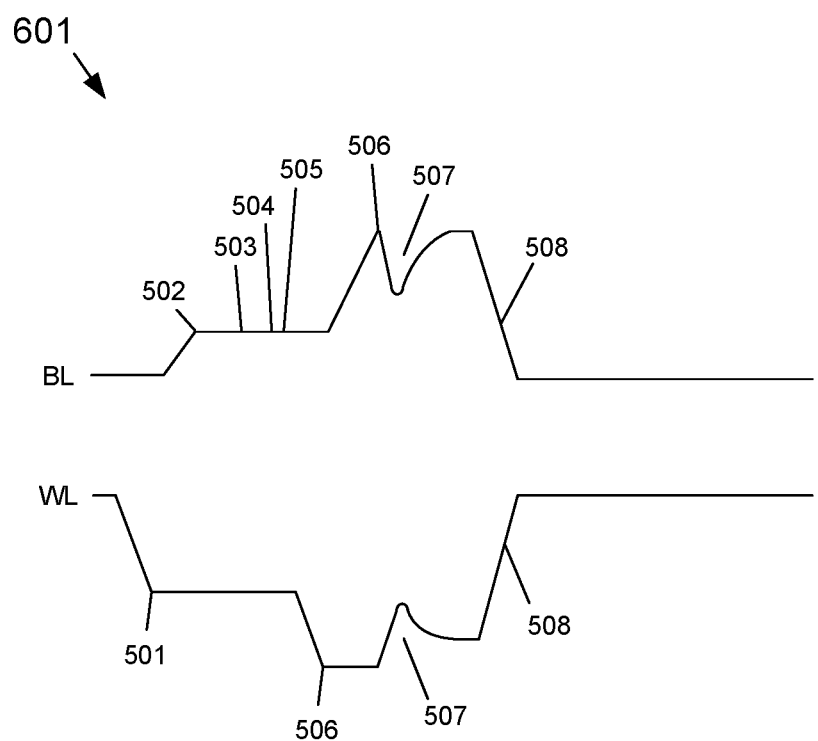
FIG. 6A depicts a waveform diagram corresponding to the operations of write technique depicted in FIG. 5 for memory cells being written from the SET to the RESET state.
Figure 6B:
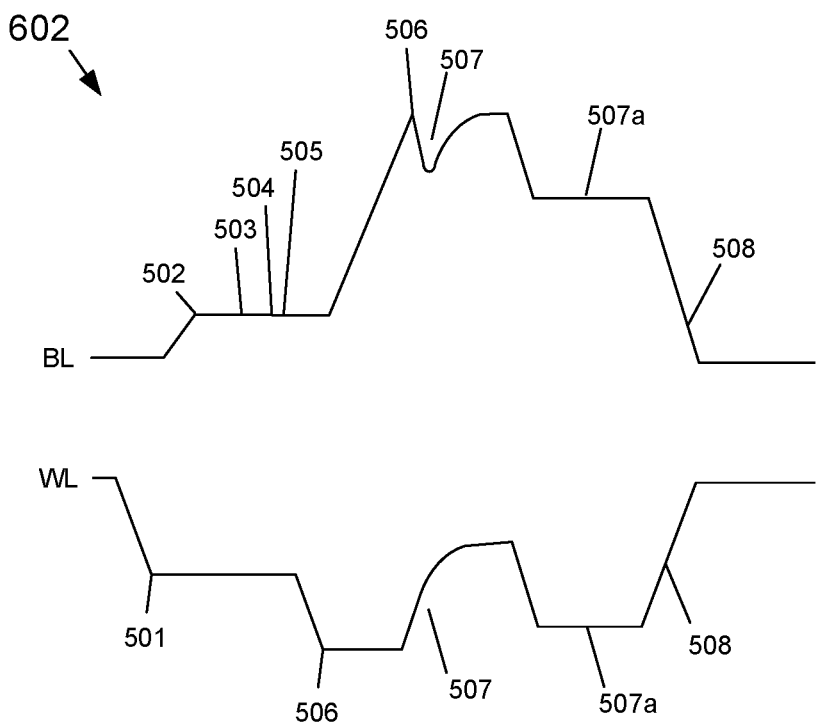
FIG. 6B depicts a waveform diagram corresponding to the operations of write technique depicted in FIG. 5 for memory cells being written from the RESET to the SET state.

FIG. 6A depicts a waveform diagram 601 corresponding to the operations of write technique 500 for memory cells being written from the SET to the RESET state. FIG. 6B depicts a waveform diagram 602 corresponding to the operations of write technique 500 for memory cells being written from the RESET to the SET state. The reference numerals in FIGS. 6A and 6B indicate portions of the respective waveforms corresponding to the particular operations of write technique 500. Additionally, for the following example based on FIGS. 5, 6A and 6B, memory cells in the SET state are selected (i.e., turned on) if a voltage greater than the threshold voltage ($VT_S$) is applied across the memory cell, which for this example is about 5.5 V. Memory cell in the RESET state are selected (i.e., turned on) if a voltage greater than the threshold voltage ($VT_R$) is applied across the memory cell, which for this example is about 8 V. It should be noted that the different voltage levels of the waveforms in FIGS. 6A and 6B are not specifically indicated and it is intended that the different parts of the waveforms are shown in a relative relationship with respect to other parts of the waveforms.

The pre-read phase begins at block 501 where the operations of address buffer and decode controller circuitry 103 and WL decoder 106 have occurred so that word lines that are part of write technique 500 are selected. Additionally, at block 501, the selected word lines are charged to a read voltage (WL Read V in FIG. 2). That is, WL voltage supply MUX 108 couples WL Read V to WL Decoder 106 and the selected word lines charge to WL Read V. In one exemplary embodiment, WL Read V is about −2.5 V.

At block 502, the operations of address buffer and decode controller circuitry 103 and BL decoder 105 have occurred so that bit lines that are part of the write technique 500 are selected. Also at block 502, the selected bit lines are charged to a read voltage (BL Read V in FIG. 2). That is, BL voltage supply MUX 107 couples BL Read V to BL Decoder 105 and the selected bit lines are charged to BL Read V. In one exemplary embodiment, BL Read V is about +3 V.

At block 503, the memory cells in the SET state (i.e., logic 1) are selected and the memory cells in the RESET state (i.e., logic 0) are not selected. In one exemplary embodiment, the voltage applied to the memory cells is selected based on the incoming data state (i.e. data that user wishes to write) to minimize read disturb of memory cells having a SET state.

At 504, the memory cells are sensed (i.e., read) by sense 109 using a static-type read technique. This is in contrast to the float-type read of the write technique of FIG. 3.

Flow continues to the mask phase at block 505 where it is determined whether a memory cell is to change state or remain in its current state. In one exemplary embodiment, the current states of the memory cells are compared to the incoming user data to determine whether the state of a particular memory cell is to be changed (or written) during the write operation. Cells that do not need to be changed are masked off and will not receive a write pulse during the write phase. According to write technique 500, the memory cells in the SET state that are to be changed from the SET state to the RESET state are kept on (i.e., remain selected).

At 506, the write phase begins and the word lines of the memory cells that are to be written (i.e., not masked) are charged to a write voltage (i.e., HNVNN) of, for example, about −4 V. The state of the memory cell is changed based on a current profile of the current that is enabled to flow through the memory cell. In one exemplary embodiment, the current profile used is a square current pulse in which if the memory cell is to be changed from RESET to SET, a relatively low current of, for example, about 50 µA is passed through the cell for about 200 ns. If the memory cell is to be changed from SET to RESET, the current profile used is a square current pulse in which, for example, about 100 µA is passed through the cell for about 10 ns. In another exemplary embodiment, a SET and RESET current profiles that is used is different from the SET and RESET square current pulse just described. The specific current profile is controlled by WL SET CURRENT CONTROL 108a and by WL RESET CURRENT CONTROL 108b in FIG. 2. It should be noted that after a memory cell has been selected for a write operation, the voltage required to keep the memory cell selected is a function of the current and resistance in the path through the memory cell. Because the current is controlled in accordance with the particular current profile that is used and because there is a variable amount of resistance in the path to the cell, the voltage on the word line coupled to a selected memory cell varies widely. Accordingly, the description herein of the exemplary operations of FIG. 5 will focus on the voltage applied to the memory array in the word line path of the selected cell, i.e., about −4 V.

The bit lines are charged toward a write voltage of (BL Write Cell Sel V in FIG. 2), for example, about 4 V (506 in FIGS. 6A and 6B). If a memory cell is in the SET state and is to be changed to the RESET state, the memory cell is selected (i.e., turns on) and begins to conduct. A RESET write-current pulse is applied as depicted by the transient-type waveform indicated at 507 in FIG. 6A. The state of the memory cell is changed from SET to RESET. If a memory cell is in the RESET state and is to be changed to the SET state, the memory cell is selected (i.e. turns on) and begins to conduct as depicted by the transient-type waveform indicated at 507 in FIG. 6B. Next, the bit line is connected to a SET pulse voltage (BL Set Pulse V in FIG. 2), for example, about 3 V in FIG. 6B and a SET write-current pulse is applied as depicted at 507a. The state of the memory cell is changed from RESET to SET. In one exemplary embodiment, the sequence of SET-to-RESET and RESET-to-SET write-current pulses are as shown in FIGS. 6A and 6B. That is, a SET-to-RESET write-current pulse occurs at a different time from a RESET-to-SET write-current pulse. In another exemplary embodiment, the SET-to-RESET and RESET-to-SET write-current pulses occur substantially simultaneously. Additionally, while FIGS. 6A and 6B depict the word lines being charged to the write voltage before the bit lines are charged to the write voltage, it should be understood that the bit lines could be charged to the write voltage before the word lines are charged to the write voltage. At block 508, the bit lines and word lines are discharged, thereby completing write technique 500.

Figure 7:
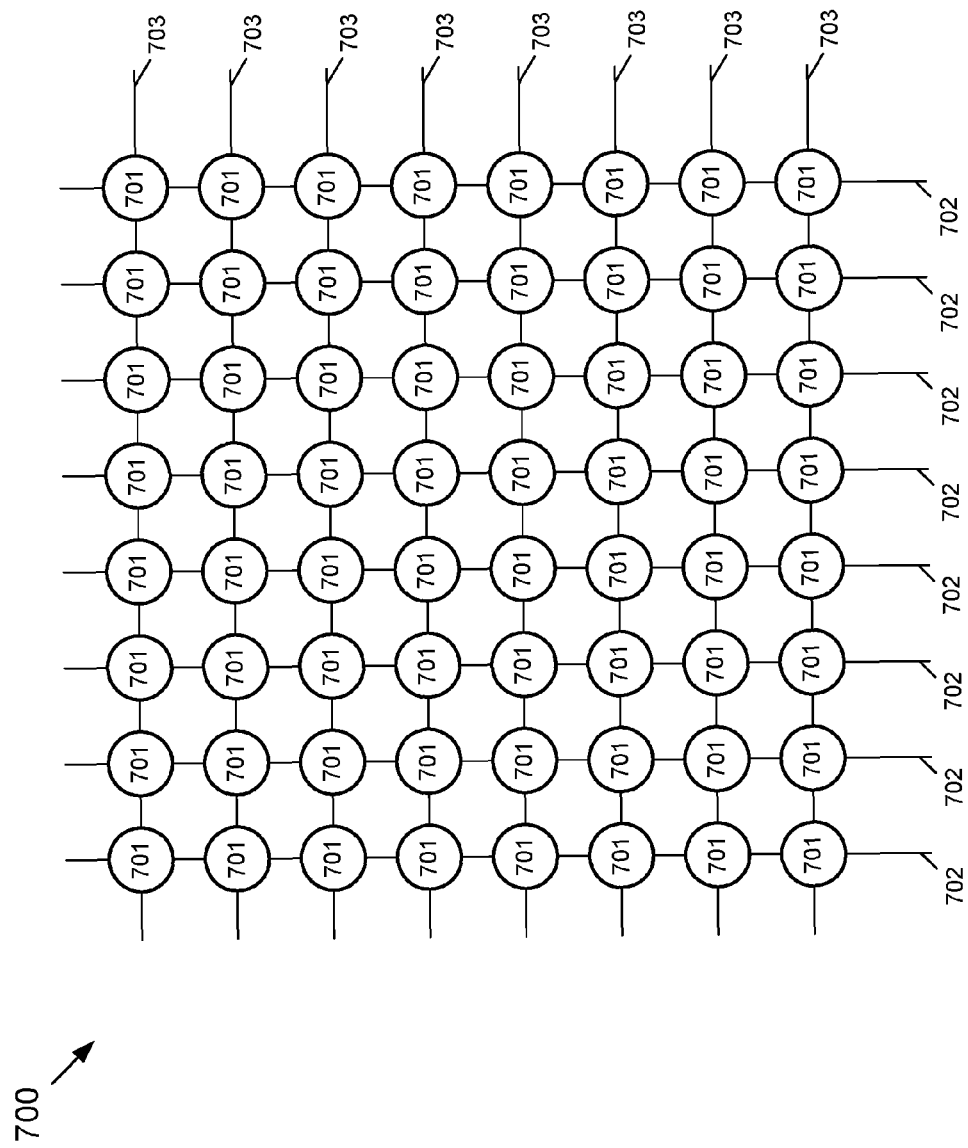
FIG. 7 depicts a schematic diagram of an exemplary embodiment of a memory array that comprises a write technique for a cross-point memory that combines a memory cell selection process for a pre-read operation and for a write operation into a single-selection write operation according to the subject matter disclosed herein.

FIG. 7 depicts a schematic diagram of an exemplary embodiment of a memory array 700 that comprises a write technique for a cross-point memory that combines a memory cell selection process for a pre-read operation and for a write operation into a single-selection write operation according to the subject matter disclosed herein. As depicted in FIG. 7, memory cells 701 are located at intersections of column signal lines 702 (e.g., bit lines) and row signal lines 703 (e.g., word lines). Individual column and/or row signal lines are electrically connected in a to a memory controller (not shown) to selectively operate memory cells 701. It should be understood that memory array 700 can comprise part of a solid-state memory array or a solid-state drive that is coupled in a well-known manner to a computer system or an information-processing system (not shown).

Figure 8:
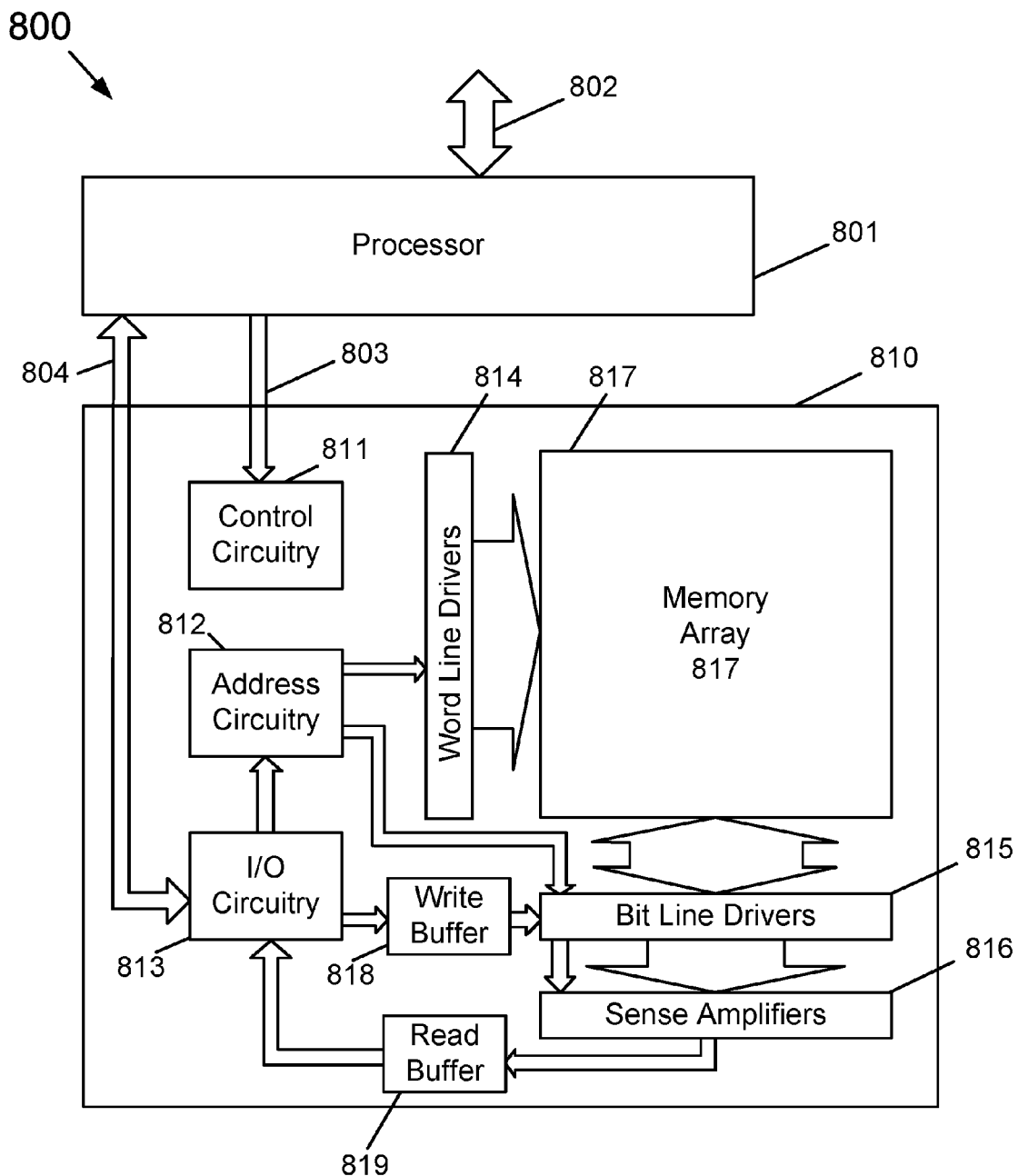
FIG. 8 depicts a functional block diagram of an exemplary embodiment of an electronic system comprising a memory array that utilizes a write technique for a cross-point memory that combines a memory cell selection process for a pre-read operation and for a write operation into a single-selection write operation according to the subject matter disclosed herein.

FIG. 8 depicts a functional block diagram of an exemplary embodiment of an electronic system 800 comprising a memory array that utilizes a write technique for a cross-point memory that combines a memory cell selection process for a pre-read operation and for a write operation into a single-selection write operation according to the subject matter disclosed herein. System 800 comprises a processor 801 that is coupled to a memory device 810 through control/address lines 803 and data lines 804. In some exemplary embodiments, data and control may utilize the same physical lines. In some exemplary embodiments, processor 801 may be an external microprocessor, microcontroller, or some other type of external controlling circuitry. In other exemplary embodiments, processor 801 may be integrated in the same package or even on the same die as memory device 810. In some exemplary embodiments, processor 801 may be integrated with the control circuitry 811, thereby allowing some of the same circuitry to be used for both functions. Processor 801 may have external memory, such as random access memory (RAM) (not shown) and/or read only memory (ROM) (not shown), that is used for program storage and intermediate data. Alternatively, processor 801 may have internal RAM or ROM. In some exemplary embodiments, processor 801 may use memory device 810 for program or data storage. A program running on processor 801 may implement many different functions including, but not limited to, an operating system, a file system, defective chunk remapping, and error management.

In some exemplary embodiments, an external connection 802 is provided that allows processor 801 to communicate to external devices (not shown). Additional I/O circuitry (not shown) may be used to couple external connection 802 to processor 801. If electronic system 800 is a storage system, external connection 802 may be used to provide an external device with non-volatile storage. In one exemplary embodiment, electronic system 800 may be, but is not limited to, a solid-state drive (SSD), a USB thumb drive, a secure digital card (SD Card), or any other type of storage system. External connection 802 may be used to connect to a computer or other intelligent device, such as a cell phone or digital camera, using a standard or proprietary communication protocol. Exemplary computer communication protocols that may be compatible with external connection 802 include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

If electronic system 800 is a computing system, such as a mobile telephone, a tablet, a notebook computer, a set-top box, or some other type of computing system, external connection 802 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)—Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

Memory device 810 may include an array 817 of memory cells. Memory cell array 817 may be organized as a two dimensional or a three dimensional cross-point array and may include a phase-change memory (PCM), a phase-change memory with switch (PCMS), a resistive memory, nanowire memory, ferro-electric transistor random access memory (FeTRAM), a flash memory, magnetoresistive random access memory (MRAM) memory that incorporates memristor technology, a spin transfer torque (STT)-MRAM, or any other type of memory constructed as a cross-point array. Memory array 817 may be coupled to the word line drivers 814 and/or bit line drivers 815, and/or sense amplifiers 816. Address lines and control lines 803 may be received and decoded by control circuitry 811, I/O circuitry 813 and address circuitry 812, which may provide control to the memory array 817. I/O circuitry 813 may couple to data lines 804 thereby allowing data to be received from and sent to processor 801. Data read from memory array 817 may be temporarily stored in read buffers 819. Data to be written to memory array 817 may be temporarily stored in write buffers 818 before being transferred to the memory array 817.

It should be understood that electronic system 800 depicted in FIG. 8 has been simplified to facilitate a basic understanding of the features of the system. Many different embodiments are possible including using a single processor 801 to control one or more memory devices 810 to provide for more storage space. Additional functions, such as a video graphics controller driving a display, and other devices for human-oriented I/O may be included in some exemplary embodiments.

Figure 9:
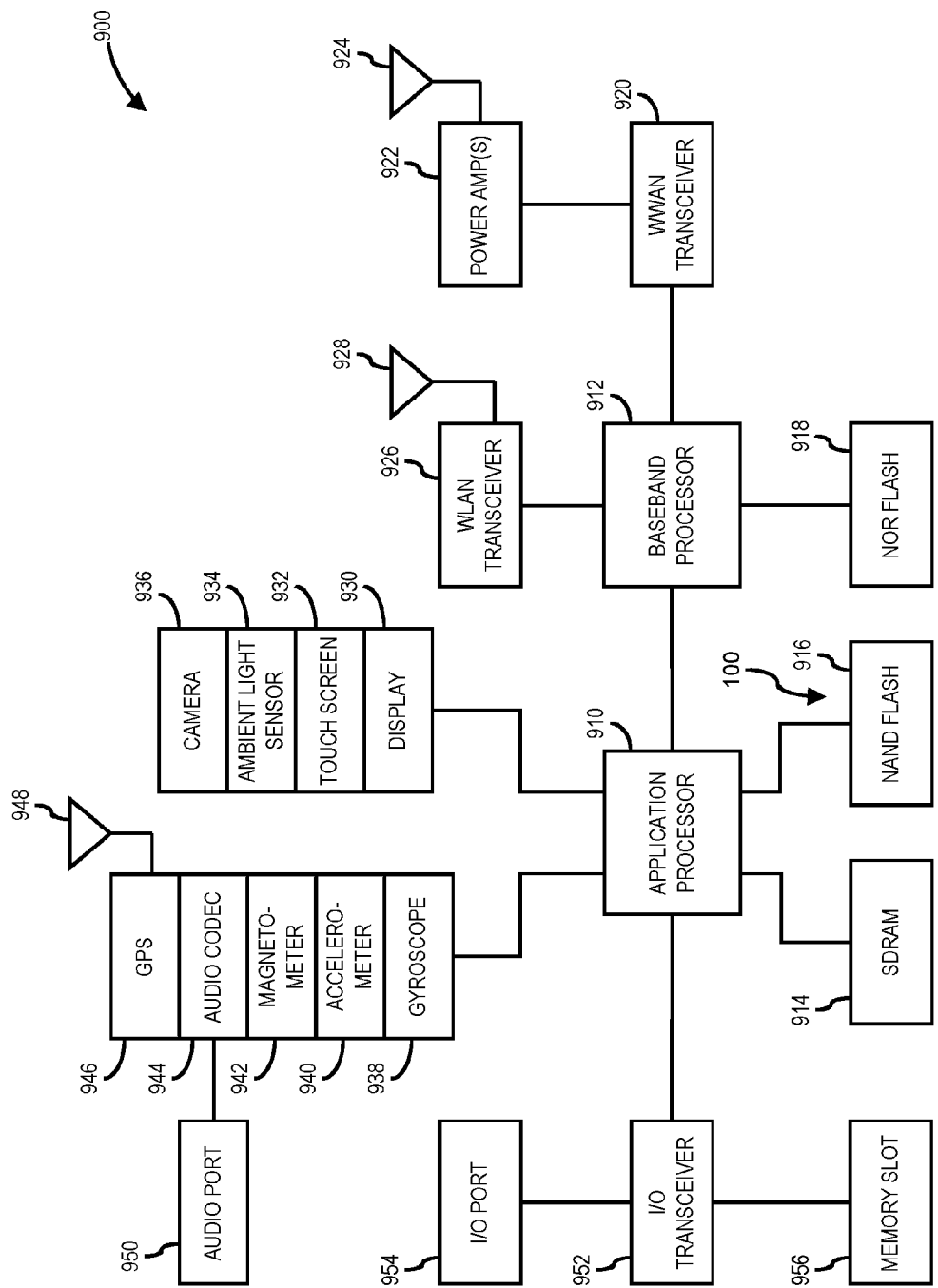
FIG. 9 depicts a block diagram of an information handling system having a memory device that utilizes a write technique for a cross-point memory that combines a memory cell selection process for a pre-read operation and for a write operation into a single-selection write operation according to the subject matter disclosed herein.

Referring now to FIG. 9, a block diagram of an information handling system having a memory device that utilizes a write technique for a cross-point memory that combines a memory cell selection process for a pre-read operation and for a write operation into a single-selection write operation in accordance with one or more embodiments will be discussed. Information handling system 900 of FIG. 9 may tangibly embody at least in part any one or more of the elements described herein, above, including for example memory device 100 and processor 101 of FIG. 1, or memory device 810 and processor 802 of FIG. 8, with greater or fewer components depending on the hardware specifications of the particular device. Although information handling system 900 represents one example of several types of computing platforms, information handling system 900 may include more or fewer elements and/or different arrangements of elements than shown in FIG. 9, and the scope of the claimed subject matter is not limited in these respects.

In one or more embodiments, information handling system 900 may include an application processor 910 and a baseband processor 912. Application processor 910, which may tangibly embody processor 101 of FIG. 1 or processor 802 of FIG. 8, may be utilized as a general-purpose processor to run applications and the various subsystems for information handling system 900. Application processor 910 may include a single core or alternatively may include multiple processing cores wherein one or more of the cores may comprise a digital signal processor or digital signal processing (DSP) core. Furthermore, application processor 910 may include a graphics processor or coprocessor disposed on the same chip, or alternatively a graphics processor coupled to application processor 910 may comprise a separate, discrete graphics chip. Application processor 910 may include on board memory such as cache memory, and further may be coupled to external memory devices such as synchronous dynamic random access memory (SDRAM) 914 for storing and/or executing applications during operation, and NAND flash 916, which may tangibly embody memory device 100 of FIG. 1 or memory device 810 of FIG. 8, for storing applications and/or data even when information handling system 900 is powered off. In one or more embodiments, instructions and/or software to operate or configure the information handling system 900 and/or any of its components or subsystems to operate in a manner as described herein may be stored on an article of manufacture comprising a non-transitory storage medium. In one or more embodiments, the storage medium may comprise any of the memory devices shown in and described herein, although the scope of the claimed subject matter is not limited in this respect. Baseband processor 912 may control the broadband radio functions for information handling system 900. Baseband processor 912 may store code for controlling such broadband radio functions in a NOR flash 918. Baseband processor 912 controls a wireless wide area network (WWAN) transceiver 920 which is used for modulating and/or demodulating broadband network signals, for example for communicating via a 3GPP LTE or LTE-Advanced network or the like.

In general, WWAN transceiver 920 may operate according to any one or more of the following radio communication technologies and/or standards including but not limited to a Global System for Mobile Communications (GSM) radio communication technology and/or a Third Generation Partnership Project (3GPP) radio communication technology such as Long Term Evolution Advanced (4th Generation) (LTE Advanced (4G)), and/or general telemetry transceivers, and in general any type of RF circuit or RFI sensitive circuit. It should be noted that such standards may evolve over time, and/or new standards may be promulgated, and the scope of the claimed subject matter is not limited in this respect.

The WWAN transceiver 920 couples to one or more power amps 922 respectively coupled to one or more antennas 924 for sending and receiving radio-frequency signals via the WWAN broadband network. The baseband processor 912 also may control a wireless local area network (WLAN) transceiver 926 coupled to one or more suitable antennas 928 and which may be capable of communicating via a Wi-Fi, Bluetooth®, and/or an amplitude modulation (AM) or frequency modulation (FM) radio standard including an IEEE 802.11 a/b/g/n standard or the like. It should be noted that these are merely example implementations for application processor 910 and baseband processor 912, WWAN transceiver 920, and/or WLAN transceiver 926, and the scope of the claimed subject matter is not limited in these respects. In addition, any one or more of SDRAM 914, NAND flash 916 and/or NOR flash 918 may comprise other types of memory technology such as magnetic memory, chalcogenide memory, phase change memory, or ovonic memory, and the scope of the claimed subject matter is not limited in this respect.

In one or more embodiments, application processor 910 may drive a display 930 for displaying various information or data, and may further receive touch input from a user via a touch screen 932 for example via a finger or a stylus. An ambient light sensor 934 may be utilized to detect an amount of ambient light in which information handling system 900 is operating, for example to control a brightness or contrast value for display 930 as a function of the intensity of ambient light detected by ambient light sensor 934. One or more cameras 936 may be utilized to capture images that are processed by application processor 910 and/or at least temporarily stored in NAND flash 916. Furthermore, application processor 910 may couple to one or more sensors including but not limited to a gyroscope 938, accelerometer 940, magnetometer 942, audio coder/decoder (CODEC) 944, and/or global positioning system (GPS) controller 946 coupled to an appropriate GPS antenna 948, for detection of various environmental properties including location, movement, and/or orientation of information handling system 900. Alternatively, controller 946 may comprise a Global Navigation Satellite System (GNSS) controller. Audio CODEC 944 may be coupled to one or more audio ports 950 to provide microphone input and speaker outputs either via internal devices and/or via external devices coupled to information handling system via the audio ports 950, for example via a headphone and microphone jack. In addition, application processor 910 may couple to one or more input/output (I/O) transceivers 952 to couple to one or more I/O ports 954 such as a universal serial bus (USB) port, a high-definition multimedia interface (HDMI) port, a serial port, and so on. Furthermore, one or more of the I/O transceivers 952 may couple to one or more memory slots 956 for optional removable memory such as secure digital (SD) card or a subscriber identity module (SIM) card, although the scope of the claimed subject matter is not limited in these respects.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

The invention claimed is:

1. A method comprising:
    selecting memory cells of a memory device to read responsive to a write operation;
    sensing a state of the selected memory cells and leaving the selected memory cells on;
    determining which of the selected memory cells are to change state based on user data for the write operation;
    applying a write-current pulse to one or more memory cells of the selected memory cells that are determined to change state for the write operation; and
    masking one or more remaining memory cells of the selected memory cells that are determined to not change state so that the write-current pulse is not applied to the one or more remaining memory cells.

2. The method according to claim 1, sensing the state of the selected memory cells comprises snap detecting to sense the state of the selected memory cells.

3. The method according to claim 1, comprising the write-current pulse having a square-pulse current profile of about 50 µA that is passed through a memory cell for about 200 ns for a memory cell that is to change state from a RESET state to a SET state.

4. The method according to claim 1, comprising the write-current pulse having a square-pulse current profile of about 100 µA that is passed through a memory cell for about 10 ns for a memory cell that is to change state from a SET state to a RESET state.

5. The method of claim 1, the memory device comprises a two dimensional or a three dimensional cross-point memory array.

6. The method of claim 5, the two dimensional or the three dimensional cross-point memory array includes phase-change memory (PCM), PCM with switch (PCMS), resistive memory, nanowire memory, ferro-electric transistor random access memory (FETRAM), flash memory, magnetoresistive random access memory (MRAM) that incorporates memristor technology or spin transfer torque (STT)-MRAM.

7. A method comprising:
    selecting memory cells of a memory device to sense a state of the selected memory cells responsive to a write operation;
    determining which of the selected memory cells are to change state based on user data for the write operation;
    applying a write-current pulse to one or more memory cells of the selected memory cells that are determined to change state for the write operation; and
    masking one or more remaining memory cells of the selected memory cells that are determined to not change state so that the write-current pulse is not applied to the one or more remaining memory cells.

8. The method according to claim 7, sensing the state of the selected memory cells comprises snap detecting to sense the state of the selected memory cells.

9. The method according to claim 7, comprising the write-current pulse having a square-pulse current profile of about 50 µA that is passed through a memory cell for about 200 ns for a memory cell that is to change state from a RESET state to a SET state.

10. The method according to claim 7, comprising the write-current pulse having a square-pulse current profile of about 100 µA that is passed through a memory cell for about 10 ns for a memory cell that is to change state from a SET state to a RESET state.

11. The method of claim 7, the memory device comprises a two dimensional or a three dimensional cross-point memory array.

12. The method of claim 11, the two dimensional or the three dimensional cross-point memory array includes phase-change memory (PCM), PCM with switch (PCMS), resistive memory, nanowire memory, ferro-electric transistor random access memory (FETRAM), flash memory, magnetoresistive random access memory (MRAM) that incorporates memristor technology or spin transfer torque (STT)-MRAM.

13. A memory device, comprising:
an array of memory cells;
address circuitry to select memory cells from among the array of memory cells and to keep the selected memory cells selected while the selected memory cells are sensed and written responsive to a write operation to the memory device;
sense circuitry to sense a state of the selected memory cells;
write circuitry that writes user data for the write operation into the selected memory cells as the selected memory cells remain selected; and
control circuitry to determine which of the selected memory cells are to change state based on the user data that is to be written into the selected memory cells and to mask one or more remaining memory cells of the selected memory cells that are determined to not change state.

14. The memory device according to claim 13, the user data to be written into the selected memory cells comprises the write circuitry to apply a write-current pulse to one or more memory cells of the selected memory cells that are determined to change state, wherein the masked one or more remaining memory cells of the selected memory cells are masked from the write-current pulse.

15. The memory device according to claim 14, comprising the write-current pulse having a square-pulse current profile of about 50 µA that is passed through a memory cell for about 200 ns for a memory cell that is to change state from a RESET state to a SET state.

16. The memory device according to claim 14, comprising the write-current pulse having a square-pulse current profile of about 100 µA that is passed through a memory cell for about 10 ns for a memory cell that is to change state from a SET state to a RESET state.

17. The memory device according to claim 13, the memory device comprises a solid-state drive (SSD).

18. The memory device of claim 13, the memory array comprises a two dimensional or a three dimensional cross-point memory array.

19. The memory device of claim 18, the two dimensional or the three dimensional cross-point memory array includes phase-change memory (PCM), PCM with switch (PCMS), resistive memory, nanowire memory, ferro-electric transistor random access memory (FETRAM), flash memory, magnetoresistive random access memory (MRAM) that incorporates memristor technology or spin transfer torque (STT)-MRAM.

20. A memory device, comprising:
an array of memory cells;
address circuitry to select memory cells from among the array of memory cells responsive to a write operation to the memory device;
sense circuitry to sense a state of the selected memory cells;
write circuitry that writes user data for the write operation into the selected memory; and
control circuitry to determine which of the selected memory cells are to change state based on the user data that is to be written into the selected memory cells and to mask one or more remaining memory cells of the selected memory cells that are determined to not change state.

21. The memory device according to claim 20, the user data to be written into the selected memory cells comprises the write circuitry to apply a write-current pulse to one or more memory cells of the selected memory cells that are determined to change state, wherein the masked one or more remaining memory cells of the selected memory cells are masked from the write-current pulse.

22. The memory device according to claim 21, comprising the write-current pulse having a square-pulse current profile of about 50 µA that is passed through a memory cell for about 200 ns for a memory cell that is to change state from a RESET state to a SET state.

23. The memory device according to claim 21, comprising the write-current pulse having a square-pulse current profile of about 100 µA that is passed through a memory cell for about 10 ns for a memory cell that is to change state from a SET state to a RESET state.

24. The memory device according to claim 20, the memory device comprises a solid-state drive (SSD).

25. The memory device of claim 20, the memory array comprises a two dimensional or a three dimensional cross-point memory array.

26. The memory device of claim 25, the two dimensional or the three dimensional cross-point memory array includes phase-change memory (PCM), PCM with switch (PCMS), resistive memory, nanowire memory, ferro-electric transistor random access memory (FETRAM), flash memory, magnetoresistive random access memory (MRAM) that incorporates memristor technology or spin transfer torque (STT)-MRAM.

* * * * *